(12) United States Patent  
Isono

(10) Patent No.: US 6,925,026 B2
(45) Date of Patent: Aug. 2, 2005

(54) SEMICONDUCTOR DEVICE ADAPTED FOR POWER SHUTDOWN AND POWER RESUMPTION

(75) Inventor: Takanori Isono, Joyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/442,713

(22) Filed: May 20, 2003

(65) Prior Publication Data

US 2003/0218915 A1 Nov. 27, 2003

(30) Foreign Application Priority Data

May 23, 2002 (JP) .......................................... 2002-149829

(51) Int. Cl.[7] .................. G11C 5/14; G11C 11/4074; G11C 11/4193; H01L 23/528
(52) U.S. Cl. ........................ 365/229; 365/227; 716/8; 257/E23.153
(58) Field of Search .......................... 365/228, 229, 365/227, 226, 51, 63, 72; 716/8; 257/E23.153

(56) References Cited

U.S. PATENT DOCUMENTS 4,654,829 A * 3/1987 Jiang et al. ............ 365/189.03
5,515,232 A * 5/1996 Fukazawa et al. ............ 361/111
5,650,974 A * 7/1997 Yoshimura .................. 365/229
5,783,964 A * 7/1998 Eitan ........................... 327/408
5,801,457 A * 9/1998 Hong et al. ................... 307/80
6,256,252 B1 * 7/2001 Arimoto ....................... 365/227
6,308,307 B1 * 10/2001 Cano et al. ..................... 716/8
6,493,257 B1 * 12/2002 Coughlin et al. ............ 365/156

* cited by examiner

Primary Examiner—Richard Elms
Assistant Examiner—J. H. Hur
(74) Attorney, Agent, or Firm—Hamre, Schumann, Mueller & Larson, P.C.

(57) ABSTRACT

A semiconductor device that achieves high speed and low power consumption that can be used in a real-time system by preventing held data from disappearing at the time of power shutdown and sharply rising power while also preventing a through-current at the time of power resumption. During normal operation, the switch is on, and the clock generating circuit and the data holding circuit are operated with the first power supply voltage. When data holding is required at the time of power shutdown, the switch and the first power supply voltage supplied to the logic circuit are turned off, and the clock generating circuit and the data holding circuit are operated with the second power supply voltage.

7 Claims, 6 Drawing Sheets

SEMICONDUCTOR DEVICE ADAPTED FOR POWER SHUTDOWN AND POWER RESUMPTION

BACKGROUND OF THE INVENTION

1. Field of the Invention

The present invention relates to a circuit technology for preventing data held in a register or the like from disappearing at the time of power shutdown, reducing significantly a time for turning power on again, and decreasing leak current when the power is turned on.

2. Description of the Related Art

In recent years, process miniaturization and a reduction in power supply voltage have been required as high-speed and low power consumption of semiconductor devices are achieved. On the other hand, with a reduction in power supply voltage, a reduction in a threshold value of CMOS also is required in order to achieve high-speed operation of circuits. In this case, power consumption due to off-leak current increases, so that another problem is caused in that stand-by time in mobile equipment such as portable phones is decreased. In order to decrease the off-leak current, a power shutdown technique is required.

The power shutdown technique to reduce off-leak current and achieve low power consumption gradually has been put into practice. FIG. 10 is a schematic diagram showing partially a circuit block of a conventional semiconductor device that performs power shutdown. In FIG. 10, reference numeral 101 denotes a clock generating circuit for generating a clock CLK, reference numeral 102 denotes a data holding circuit such as a register for holding data at a timing of a clock CLK from the clock generating circuit 101, reference numeral 103 denotes a logic circuit, reference numeral 104 denotes a shutdown power line through which a power supply voltage VDD1 is supplied/shut down, and reference numeral 107 denotes a ground line that is pulled to a ground potential VSS. As shown in FIG. 10, the conventional power shutdown is performed simply by stopping application of the power supply voltage VDD1 from the outside to the power line 104.

However, the conventional power shutdown method has the following problems.

First, the data held in the data holding circuit 102 such as a resistor may disappear when the power is shut down. That is to say, in a circuit having a function of holding data by voltage supply from the power line 104, the data disappear upon power shutdown. Therefore, when power is turned on again, the state at the time of the power shutdown is not retained at all, and the system is in an initialized state, which is the same state when the system is started up. For this reason, there is a circuit having a function of shifting data in a circuit in which power shutdown does not occur and holding the data temporarily at the time of power shutdown, and transferring the data back after power is turned on again. However, this method requires time for saving data so that it cannot be used in a real-time system, which requires real-time properties.

Secondly, each node of a circuit in which power is shut down is undefined, and when power is turned on again in this state, the undefined node causes a through-current in transistors. Therefore, the time for power rising increases and thus the through-current also increases. This vicious cycle is repeated when power is turned on. In this case, power consumption due to the through-current is increased.

SUMMARY OF THE INVENTION

Therefore, with the foregoing in mind, it is an object of the present invention to provide a semiconductor device that can achieve high-speed and low consumption at the time of power shutdown and power resumption and can be used in a real-time system.

In order to achieve the above object, a semiconductor device of the present invention, which has a clock generating circuit, a data holding circuit for holding data at a timing of a clock signal from the clock generating circuit, and a logic circuit, includes a first power line (shutdown power line) connected to the logic circuit, in which supply and shutdown of a first power supply voltage (VDD1) is controlled. A second power line (holding power line) is connected to the clock generating circuit and the data holding circuit, in which supply of a second power supply voltage (VDD2) is controlled, and a switch is connected between the first power line and the second power line and is turned on or off in response to a switching control signal (NPCEN). During normal operation, the switch is on, and the clock generating circuit and the data holding circuit are operated with the first power supply voltage, and when data holding is required at the time of power shutdown, the switch is turned off, and the clock generating circuit and the data holding circuit are operated with the second power supply voltage.

According to this embodiment, a semiconductor device can achieve high speed and low power consumption and can be used in a real-time system by preventing the held data from disappearing at the time of power shutdown and sharply rising power while preventing a through-current at the time of power resumption.

In the semiconductor device of the present invention, it is preferable that the clock generating circuit has a clock mask circuit (e.g., AND gate) for masking the clock signal (CLK) with the switching control signal, and the data holding circuit holds input data when the clock signal is masked by the clock mask circuit. This is preferable because power consumption can be reduced by stopping the supply of the clock signal to other circuit blocks.

In the semiconductor device of the present invention, it is preferable that the clock generating circuit is configured by a first cell, the data holding circuit is configured by a second cell, and the logic circuit is configured by a third cell; the first power line, the switch, and the second power line are formed in this order toward a ground line in the first and the second cells; and the first power line and the ground line in the first and the second cells are formed in the same layer as the first power line and the ground line in the third cell. This is preferable because the characteristic configuration of the present invention can be attained without changing the conventional semiconductor design flow.

In this case, it is preferable that the first and the second power lines in the first and the second cells are connected perpendicularly to line layers that are formed in a mesh above the first and the second power lines. This is preferable because the line area can be reduced.

Furthermore, in the semiconductor device of the present invention, it is preferable that at the time of power shutdown, the switch is turned off by the switching control signal, and then supply of the first power supply voltage to the first power line is stopped, and at the same time, the second power supply voltage to be supplied to the second power line is dropped to an extent that the data in the data holding circuit can be held. This is preferable because off-leak current can be reduced and power consumption can be decreased.

In this case, it is preferable that at the time of power resumption, the second power supply voltage is increased to a voltage larger than the first power supply voltage during normal operation, and then supply of the first power supply voltage to the first power line is started, and the switch is turned on by the switching control signal.

Thus, at the moment the first power line is connected to the second power line, the second power supply voltage VDD2 of the second power line that has been supplied with a voltage is prevented from dropping sharply because of the first power supply voltage VDD1 of the first power line that has been shut down, and the data held in the data holding circuit are prevented from disappearing.

Furthermore, in the semiconductor device of the present invention, it is preferable that at the time of power resumption, in a state where supply of the first power supply voltage to the first power line is stopped and the switch is off by the switching control signal, the second power supply voltage is increased to a voltage larger than the first power supply voltage during normal operation. Then supply of the first power supply voltage to the first power line is started, a level of the first power supply voltage is increased to a level smaller than a threshold voltage of a transistor, and then the switch is turned on by the switching control signal, and at the same time, a level of the first power supply voltage is increased to a level during normal operation.

Thus, the leak current at the time of the power rising due to undefined nodes during power shutdown can be reduced significantly, and the power rising time can be shortened, so that higher real-time properties can be ensured.

DESCRIPTION OF THE PREFERRED EMBODIMENTS

Hereinafter, preferable embodiments of the present invention will be described with reference to the accompanying drawings.

Figure 1:
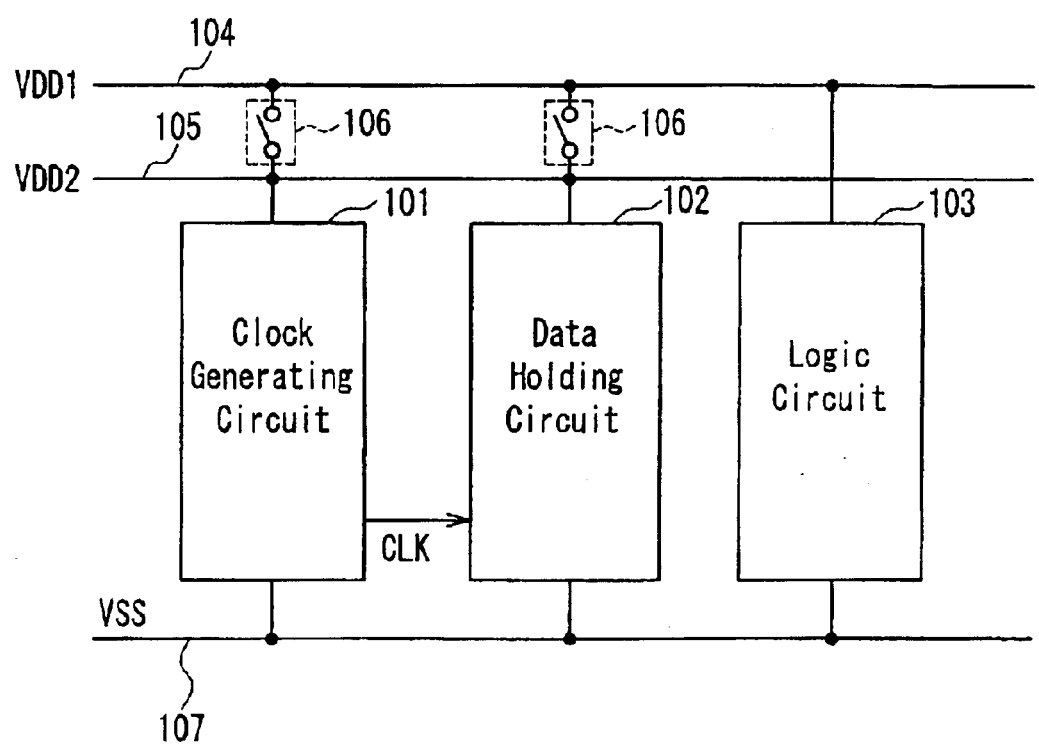
FIG. 1 is a circuit block diagram schematically showing a partial configuration of a semiconductor device according to one embodiment of the present invention.

FIG. 1 is a circuit block diagram schematically showing a partial configuration of a semiconductor device according to one embodiment of the present invention. In FIG. 1, this semiconductor device roughly consists of three blocks, that is, a clock generating circuit 101, a data holding circuit 102, and a logic circuit 103, which is similar to the conventional example. However, this embodiment is different from the conventional example in that a holding power line 105 that supplies a power supply voltage VDD2 to the clock generating circuit 101 and the data holding circuit 102 is provided parallel to a shutdown power line 104, and a switch 106 is provided between the shutdown power line 104 and the holding power line 105. The configuration and the operation of this semiconductor device will be described in detail, assuming that the components constituting each block form a cell structure.

Figure 2:
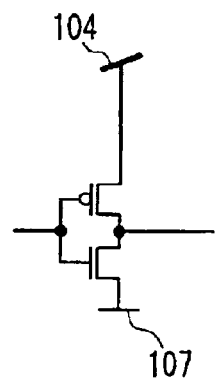
FIG. 2 is a circuit diagram showing an example of the configuration of an inverter cell in a logic circuit 103 of FIG. 1.
Figure 3:
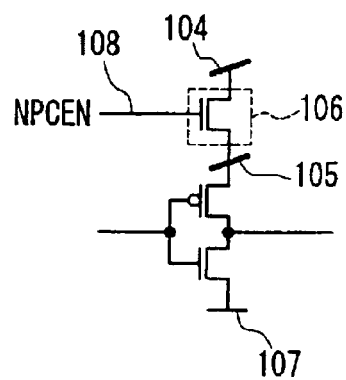
FIG. 3 is a circuit diagram showing an example of the configuration of an inverter cell in a clock generating circuit 101 of FIG. 1.
Figure 4:
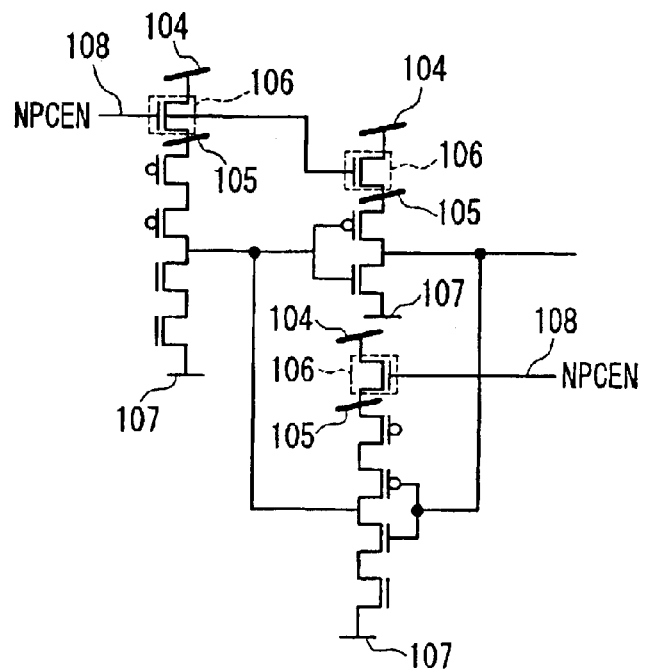
FIG. 4 is a circuit diagram showing an example of the configuration of a latch cell in a data holding circuit 102 of FIG. 1.

FIGS. 2, 3 and 4 are circuit diagrams showing an example of the configuration of an inverter cell in a logic circuit 103 of FIG. 1, an inverter cell in the clock generating circuit 101, and a latch cell in the data holding circuit 102 when viewed in the transistor level. In FIGS. 3 and 4, reference numeral 108 denotes a control signal line that is connected to the control terminal (gate) of the switch 106, and to which a switching control signal NPCEN for controlling the switch 106 to be on/off is supplied.

The holding power line 105 is arranged on the side of a ground line 107 with respect to the shutdown power line 104 of the conventional cell. The power supply voltage VDD2 is supplied from the holding power line 105 to the cell connected to the holding power line 105, even if the supply of the power supply voltage VDD1 to the shutdown power line 104 is shut down, or the shutdown power line 104 is disconnected from the holding power line 105 by the switch 106.

Figure 5:
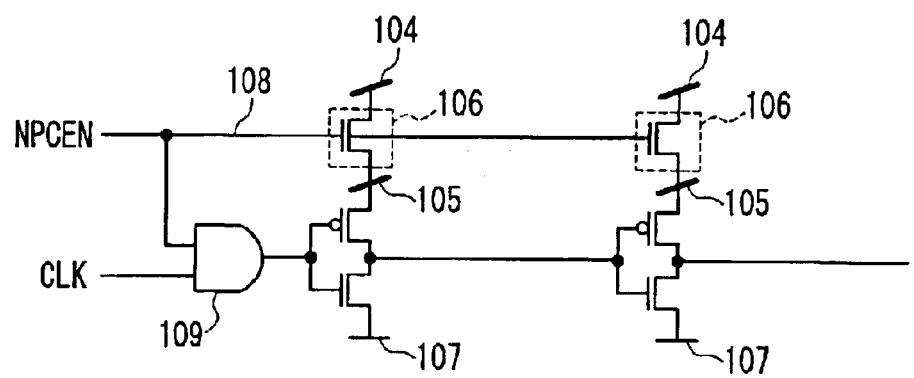
FIG. 5 is a circuit diagram showing the configuration of the clock generating circuit 101 in one embodiment of the present invention.

In addition to the cell structure shown in FIG. 3, the clock generating circuit 101 has an AND gate 109 (clock mask circuit), and a switching control signal NPCEN is supplied to one end of the AND gate, and a clock signal CLK is supplied to the other end thereof, as shown in FIG. 5. The switching control signal NPCEN is turned to a logic low level at the time of power shutdown so that the N channel MOS transistor constituting the switch 106 is turned off to disconnect the holding power line 105 from the shutdown power line 104, and the clock signal CLK is masked at the AND gate 109 so as to be turned to a low level signal. Thus, the data holding circuit 102 can hold data at the time of power shutdown.

Figure 6:
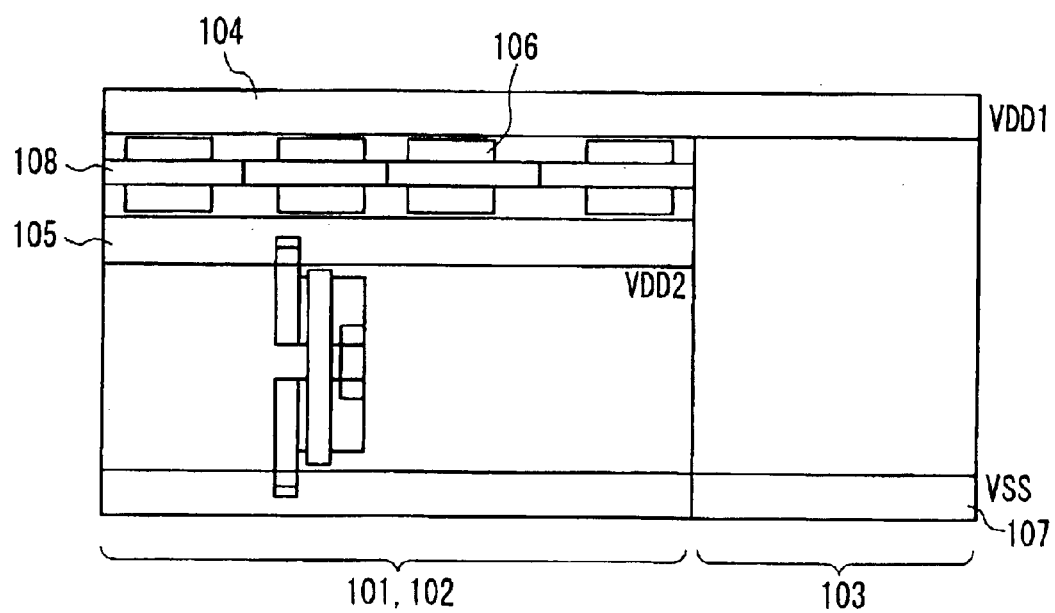
FIG. 6 is a cross-sectional view showing the cell structure and the line layout in the thickness direction in one embodiment of the present invention.

FIG. 6 is a cross-sectional view showing the cell structure and the line layout in the thickness direction. As shown in FIG. 6, the height of the cells (the clock generating circuit 101 and the data holding circuit 102) connected to the holding power line 105 is the same as that of the cell (the logic circuit 103) connected only to the conventional shutdown power line 104, so that the configuration of this embodiment can be realized without changing the conventional semiconductor design flow.

Figure 7:
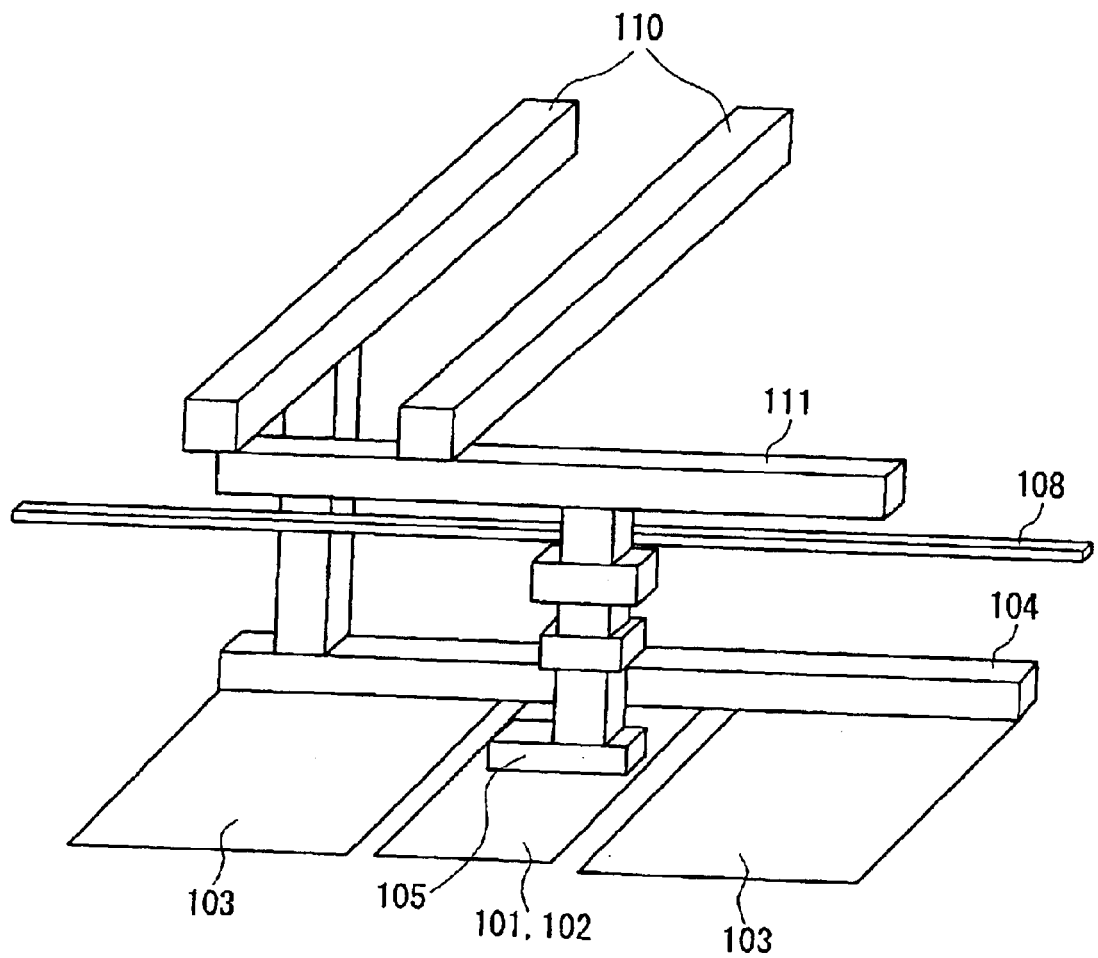
FIG. 7 is a schematic view three-dimensionally showing the mesh structure of power lines in one embodiment of the present invention.

FIG. 7 is a schematic view three-dimensionally showing the mesh structure of the power line in the cell. In recent years, as process miniaturization has been promoted, the mesh structure increasingly has been used for power lines in order to prevent the slowing of the speed due to voltage drop of the power supply caused by, for example, the on/off of the transistors. Using the mesh structure of the power lines, a power supply voltage is supplied from power lines 110 to the shutdown power line 104 and supplied from a power line 111 to the holding power line 105.

The power line in this embodiment is characterized in that a power supply voltage is supplied to the holding power line 105 and the shutdown power line 104, not from the outside of the block, but from spatially above. Thus, the conventional mesh structure of the power lines can be used and an increase in the area can be prevented. Furthermore, when the holding power line 105 is shifted from the shutdown power line 104 in the thickness direction while being parallel thereto in the longitudinal direction, as shown in FIG. 7, power supply from above is physically possible. A line layer above the line layers forming the holding power line 105 and the shutdown power line 104 is used as the control signal line 108, so that even if the voltage of the holding power line 105 or the shutdown power line 104 swings significantly, the control signal line 108 cannot be affected.

The operation at the time of power shutdown and power resumption will be described with reference to FIGS. 8 and 9.

Figure 8:
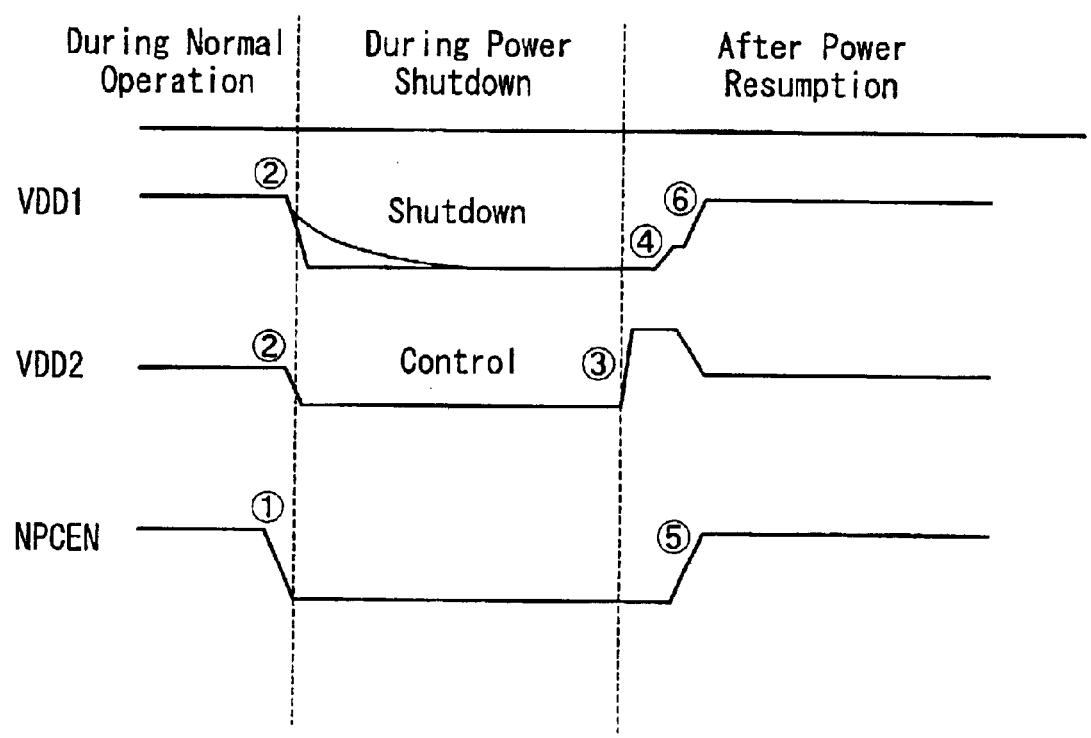
FIG. 8 is a timing chart of power supply voltages VDD1 and VDD2, and a switching control signal NPCEN during normal operation, during power shutdown and after power resumption when data holding is necessary.

FIG. 8 is a timing chart of the power supply voltages VDD1 and VDD2, and the switching control signal NPCEN during normal operation, during power shutdown and after power resumption. In FIG. 8, first, during normal operation, the switching control signal NPCEN is in a logic high level, so that the switch 106 is on, and thus the shutdown power line 104 is connected to the holding power line 105.

Then, in the power shutdown mode, first the switching control signal NPCEN is turned to a logic low level (the state of circled 1 in FIG. 8), the switch 106 is turned off, and the shutdown power line 104 is disconnected from the holding power line 105 (the state of circled 2 in FIG. 8). The clock signal CLK is masked, and at this time, the data that have been input to the data holding circuit 102 are held. Then, the supply of the power supply voltage VDD1 to the shutdown power line 104 is stopped. Also with respect to the holding power line 105, the power supply voltage VDD2 is dropped to an extent that the data can be held, so that off-leak current can be reduced and power consumption can be decreased.

Next, the operation for power resumption will be described.

For power resumption, the holding power line 105 is connected to the shutdown power line 104, and power is turned on sharply by the power supply from the two power lines. Therefore, the moment at which the shutdown power line 104 is connected to the holding power line 105, the power supply voltage VDD2 of the holding power line 105 is dropped sharply. In order to prevent data disappearance in the data holding circuit 102 at that moment, the power supply voltage VDD2 of the holding power line 105 is increased to a large voltage beforehand (the state of circled 3 in FIG. 8). Next, the power supply voltage VDD1 is supplied to the shutdown power line 104 up to a voltage just below the threshold voltage of the transistor (the state of circled 4 in FIG. 8). Then, the switching control signal NPCEN is turned to a logic high level (the state of circled 5 in FIG. 8) so as to turn the switch 106 on, so that the holding power line 105 is connected to the shutdown power line 104. At this moment, the voltage supply to the shutdown power line 104 is increased (the state of circled 6 in FIG. 8). Thus, the leak current at the time of power rising due to the nodes that have been undefined during power shutdown can be reduced significantly, and the power rising time can be shortened, so that higher real-time properties can be ensured.

Figure 9:
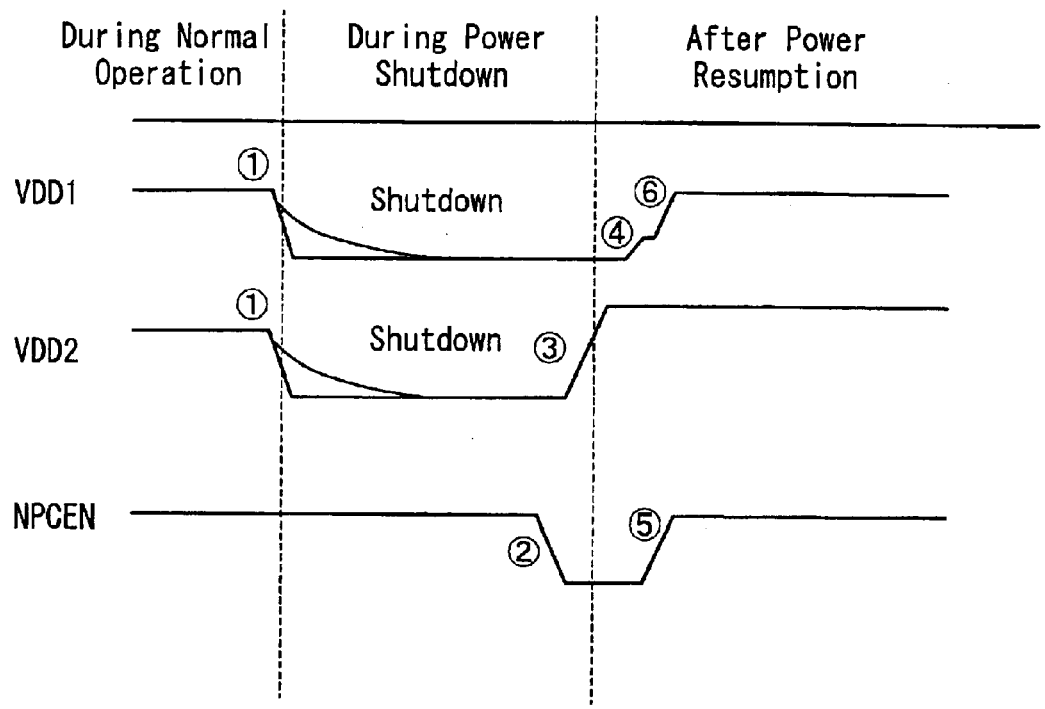
FIG. 9 is a timing chart of power supply voltages VDD1 and VDD2, and a switching control signal NPCEN during normal operation, during power shutdown and after power resumption when data holding is not necessary.
Figure 10:
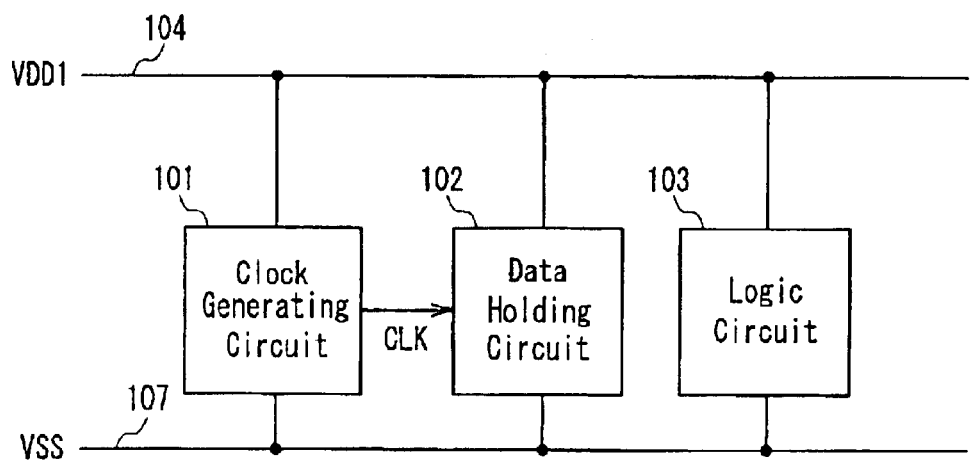
FIG. 10 is a schematic diagram partially showing a circuit block of a conventional semiconductor device.

FIG. 9 is a timing chart of the power supply voltages VDD1 and VDD2, and the switching control signal NPCEN during normal operation, during power shutdown and after power resumption when data holding is not necessary.

During the normal operation, as in FIG. 8, the switching control signal NPCEN is in a logic high level, the switch 106 is on, and the shutdown power line 104 is connected to the holding power line 105 (the state of circled 1 in FIG. 9).

Then, in the power shutdown mode, power supply to the holding power line 105 and the shutdown power line 104 is stopped while the switching control signal NPCEN remains in the logic high level so that the switch 106 is on.

Then, at the time of power resumption, the switching control signal NPCEN is turned to a logic low level beforehand so that the switch 106 is turned off to disconnect the holding power line 105 from the shutdown power line 104 (the state of circled 2 in FIG. 9). Then, first, the power supply voltage VDD2 is supplied to the holding power line 105 (the state of circled 3 in FIG. 9), and then the power supply voltage VDD1 to the shutdown power line 104 is increased to a voltage just below the threshold voltage of the transistor (the state of circled 4 in FIG. 9), and then the switching control signal NPCEN is turned to a logic high level (the state of circled 5 in FIG. 9) again so that the switch 106 is turned on. At the same time, the power supply voltage VDD1 to be supplied to the shutdown power line 104 is increased to a voltage level for normal operation (the state of circled 6 in FIG. 9). Thus, the through-current at time of the power rising due to the nodes that have been undefined during power shutdown is generated only in the clock generating circuit 101 and the data holding circuit 102, and the through-current in the logic circuit 103 is suppressed, so that power consumption can be reduced.

In the case where high speed operation is not necessary during the normal operation, the power consumption in the clock generating circuit 101 can be reduced by decreasing the power supply voltage VDD2 of the holding power line 105, and a normal power supply voltage is supplied to the logic circuit 103, so that power consumption can be reduced significantly with only low speed of the data holding circuit 102.

As described above, according to the present invention, the disappearance of the held data at the time of power shutdown and the through-current at the time of power rising, which are conventional problems, can be prevented and sharp power rising can be achieved. Thus, a high speed circuit can be realized while power consumption is suppressed, and thus a real-time system can be constructed.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device including a clock generating circuit, a data holding circuit for holding data at a timing of a clock signal from the clock generating circuit, and a logic circuit, comprising:

a first power line connected to the logic circuit, in which supply and shutdown of a first power supply voltage are controlled;

a second power line connected to the clock generating circuit and the data holding circuit, in which supply of a second power supply voltage is controlled; and a switch that is connected between the first power line and the second power line and is turned on or off in accordance with a switching control signal, wherein during normal operation, the switch is on to connect the second power line to the first power line, and the clock generating circuit and the data holding circuit are operated with the first power supply voltage, when data holding is required at a time of power shutdown, the switch is turned off to disconnect the second power line from the first power line, and the supply of the first power supply voltage to the first power line is stopped, and the clock generating circuit and the data holding circuit are operated with the second power supply voltage, and wherein both of the first power supply voltage and the second power supply voltage are supplied to the clock generating circuit and the data holding circuit at a time of power rising.

2. The semiconductor device according to claim 1, wherein the clock generating circuit has a clock mask circuit for masking the clock signal with the switching control signal, and the data holding circuit holds input data when the clock signal is masked by the clock mask circuit.

3. The semiconductor device according to claim 1, wherein the clock generating circuit is configured by a first cell, the data holding circuit is configured by a second cell, and the logic circuit is configured by a third cell, the first power line, the switch, and the second power line are formed in this order toward a ground line in the first and the second cells, and the first power line and the ground line in the first and the second cells are formed in the same layer as the first power line and the ground line in the third cell.

4. The semiconductor device according to claim 3, wherein the first and the second power lines in the first and the second cells are connected perpendicularly to line layers that are formed in a mesh above the first and the second power lines.

5. The semiconductor device according to claim 1, wherein at the time of power shutdown, the switch is turned off by the switching control signal, and then supply of the first power supply voltage to the first power line is stopped, and at the same time, the second power supply voltage to be supplied to the second power line is dropped to an extent that data in the data holding circuit can be held.

6. The semiconductor device according to claim 5, wherein at a time of power resumption, the second power supply voltage is increased to a voltage larger than the first power supply voltage during normal operation, and then supply of the first power supply voltage to the first power line is started, and the switch is turned on by the switching control signal.

7. The semiconductor device according to claim 1, wherein at a time of power resumption, in a state where supply of the first power supply voltage to the first power line is stopped and the switch is off by the switching control signal, the second power supply voltage is increased to a voltage larger than the first power supply voltage during normal operation, and then supply of the first power supply voltage to the first power line is started, a level of the first power supply voltage is increased to a level smaller than a threshold voltage of a transistor, and then the switch is turned on by the switching control signal, and at the same time, a level of the first power supply voltage is increased to a level during normal operation.

* * * * *

UNITED STATES PATENT AND TRADEMARK OFFICE
CERTIFICATE OF CORRECTION

PATENT NO.     : 6,925,026 B2
DATED          : August 2, 2005
INVENTOR(S)    : Isono It is certified that error appears in the above-identified patent and that said Letters Patent is hereby corrected as shown below:

Title page,
Item [30], Foreign Application Priority Data, "2002-149829" should read -- 2002-149629 --.

Signed and Sealed this

Twenty-eighth Day of February, 2006

JON W. DUDAS
*Director of the United States Patent and Trademark Office*